United States Patent [19]

McManis, III et al.

[11] Patent Number: 4,626,611

[45] Date of Patent: Dec. 2, 1986

[54] SHORT DURATION THERMOELECTRIC GENERATOR

[75] Inventors: George E. McManis, III; John O. Bratcher; Ronald F. Dettling, all of Ridgecrest, Calif.

[73] Assignee: The United States of America as represented by the Secretary of the Navy, Washington, D.C.

[21] Appl. No.: 750,965

[22] Filed: Jul. 2, 1985

[51] Int. Cl.⁴ .................................... H01L 35/28
[52] U.S. Cl. ........................................... 136/212
[58] Field of Search ......................... 136/208-213

[56] References Cited

U.S. PATENT DOCUMENTS

| | | | |
|---|---|---|---|
| 615,541 | 12/1898 | Emanuel | 136/201 |
| 3,070,645 | 12/1962 | Tracht | 136/208 |
| 3,262,820 | 7/1966 | Whitelaw | 136/208 |
| 3,337,309 | 8/1967 | Lewis et al. | 29/183.5 |
| 3,580,743 | 5/1971 | MacPhee et al. | 136/212 |
| 3,931,532 | 1/1976 | Byrd | 310/4 |
| 4,363,928 | 12/1982 | Wilson | 136/206 |
| 4,448,028 | 5/1984 | Chao et al. | 62/3 |
| 4,492,809 | 1/1985 | Dahlberg | 136/212 |

Primary Examiner—John F. Terapane
Assistant Examiner—T. J. Wallen
Attorney, Agent, or Firm—R. F. Beers; W. Thom Skeer

[57] ABSTRACT

A thermoelectric generator having both a hot and a cold heat sink. Fast rise times, and stable output voltages for short duration, are accomplished using fluids at their melting points at the hot and cold junctions.

10 Claims, 1 Drawing Figure

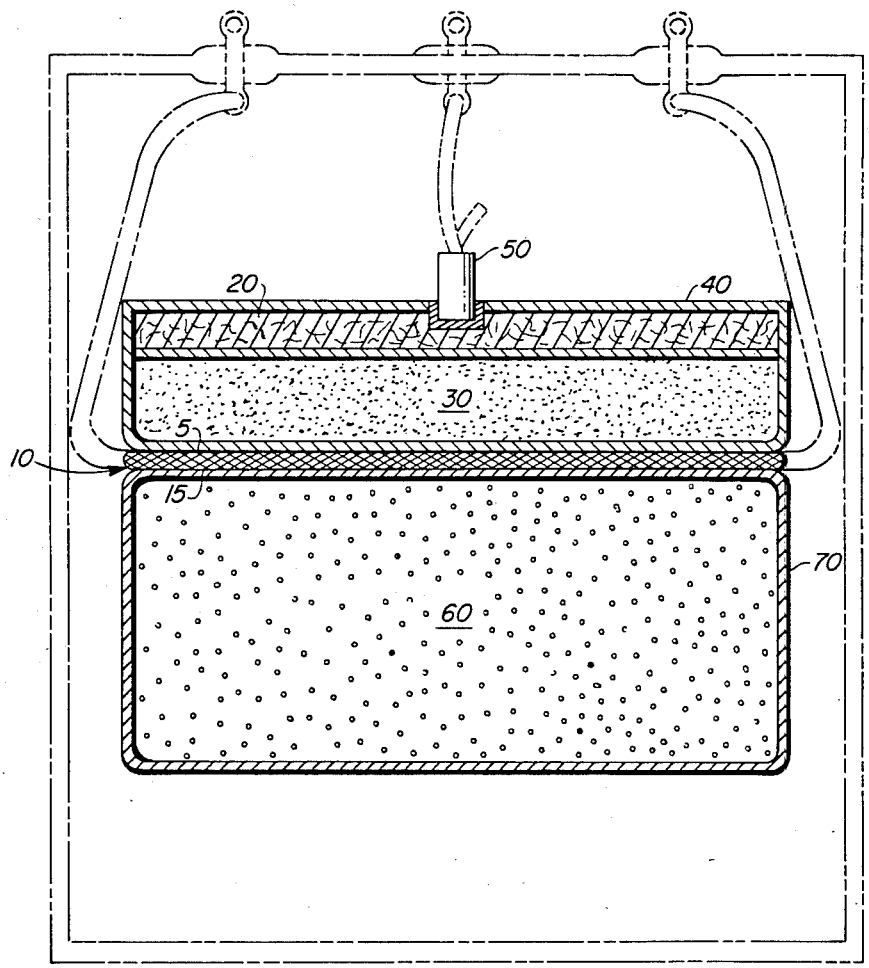

SHORT DURATION THERMOELECTRIC GENERATOR

BACKGROUND OF THE INVENTION

1. Field of the Invention

This invention relates to thermoelectric generators. More particularly, this invention relates to a thermoelectric generator having both a hot and a cold heat sink. Still more particularly, but without limitation thereto, this invention relates to a thermoelectric generator having a fast rise time at high rates, with a relatively stable voltage and high reliability for short duration.

2. Description of the Prior Art

Presently used designs which require fast rise time and a high rate power source utilize a variety of methods which are neither reliable nor inexpensive. Thermal batteries which are capable of high voltages and high loads cannot give a fast rise time ($\leqq 1$ second). Electromagnetic generators are unable to supply a stable voltage for any period over a few milliseconds. Conventional thermoelectric designs can provide only 50 to 100 milliseconds of power albeit with a fast rise time and high reliability.

SUMMARY OF THE INVENTION

According to this invention, a thermoelectric generator is designed to allow for a fast rise time at high rates with a stable voltage and high reliability for short duration, through the use of both hot and cold heat sinks, thereby creating a high temperature differential across the thermoelectric array.

BRIEF DESCRIPTION OF THE DRAWING

The single FIGURE represents a cross-sectional view of a thermoelectric generator, the casing of which (shown in phantom lines) is standard in the art.

DESCRIPTION OF THE PREFERRED EMBODIMENT

This invention uses a thermoelectric element having inherent fast rise time and high reliability, that has both the hot side and the cold side of the thermoelectric array clamped at a fixed temperature for a period up to several seconds.

In the FIGURE, a high temperature differential across the SiGe thermoelectric array 10 is maintained by using heat paper 20 to heat the hot side material 30 in the hot side heat sink 40 adjacent to the hot side 5 of array 10. Heat paper 20 is ignited by means of electric match 50.

While heat paper ($Zr/BaCrO_4$) is preferred, pyrotechnic material or $Fe/KClO_4$ is also suitable for use with this invention. Heat paper 20 heats the hot side material 30 to its melting point, thereby maintaining the hot side 5 of array 10 at or near the melting point of hot side material 30. When all of material 30 is melted, hot side heat sink 40 acts as a thermal reservoir. The heat paper used must generate a minimum of 405 cal/g and must have a burn rate of at least 36.9 in/sec.

Hot side material 30 must be non-corrosive, chemically stable and have a melting point within the range of 700°–800° C. The preferred material is a low melting borate glass such as sodium tetraborate ($Na_2B_4O_7$). Other suitable materials include: alkali metal halides such as NaBr and the NaCl-KCl eutectic, borosilicate glasses, low melting phosphate glasses such as $KPO_3$ and $NaPO_3$ and carbonates such as $K_2CO_3$.

As the hot side material 30 is melting, the cold side material 60 in the cold side heat sink 70 adjacent to the cold side 15 of array 10, absorbs the entire heat of crystallization of material 30 in the heat of fusion of material 60 upon melting. In this manner the cold side 15 of array 10 is clamped at the melting point of the cold side material 60 until all of said material is molten.

Cold side material 60 must be chemically stable and have a melting point within the range of 50°–100° C. The preferred material is an aliphatic glycyl ester such as tristearin. Other suitable materials include: fatty acids such as stearic acid, organic waxes such as paraffin, silicone waxes such as silicone grease and low melting inorganic salts such as $Ca(NO_3)_2 \cdot 4H_2O$.

Hot side heat sink 40 and cold side heat sink 70 are made of copper or steel.

By using both a hot side heat sink 40 and a cold side heat sink 70, a high temperature differential across the thermoelectric array 10 may be established. The preferred temperature difference should be within the range of 400°–700° C. Since the differential is proportional to output, a high differential provides a high, stable output voltage.

The output of the thermoelectric generator is also affected by the thermal array 10 which is comprised of a series of small elements formed by n-type and p-type junctions. Increasing the number of elements results in higher voltages while increasing the size of the elements yields more power. Therefore, the number and size of elements must be optimized given the allowed area constraints.

Table 1 provides calculated data for a thermoelectric generator having NaBr as the hot side material and tristearin as the cold side material. With a starting temperature differential of 695° C. (750°-55°), output voltages within the range of 36–42 volts are obtained. Table 1 further illustrates the effect of varying the number and size of elements in the thermoelectric array.

TABLE 1

| HOT SIDE TEMP, °C. | HOT SIDE MAT'L[a], gm | COLD SIDE TEMP, °C. | COLD SIDE MAT'L[b], gm | HEAT PAPER, gm | n-TYPE SIDE, cm | p-TYPE SIDE, cm | NUMBER OF ELEMENTS | $\Delta T$[c] | OUTPUT VOLTAGE, V |
|---|---|---|---|---|---|---|---|---|---|
| 750 | 66.2 | 55 | 64.3 | 12.6 | 0.32 | 0.29 | 184 | 430 | 36 |
| 750 | 62.5 | 55 | 60.0 | 12.0 | 0.29 | 0.27 | 214 | 444 | 42 |

[a]NaBr
[b]Tristearin
[c]Temperature differential at the end of discharge

The thermoelectric generator described herein and in the FIGURE, allows for a fast rise time at high rates, with a stable voltage and high reliability for periods of several seconds. Discharge duration is limited by the design and efficiency of the heat paper 20 and the heat sinks 40 and 70. This invention, through the novel use of both hot and cold heat sinks widely expands the utility and capability of thermoelectric generators by providing a power source with applications wherever a large amount of dependable power is required rapidly for a short discharge period.

This invention has been described in detail with particular reference to certain preferred embodiments thereof, but it will be understood that variations and modifications can be effected within the spirit and scope of the invention.

What is claimed is:

1. A thermoelectric generator capable of fast rise times and stable output voltage for short durations, having a SiGe thermoelectric array and a hot side and cold side; the improvement comprising:
    a hot side heat sink adjacent said hot side of said array, containing a material having a melting point within the range of 700° C. to 800° C. selected from the group consisting of: low melting borate glasses, alkali metal halides, borosilicate glasses, low melting phosphate glasses and carbonates;
    a cold side heat sink adjacent said cold side of said array, containing a material having a melting point within the range of 50° C. to 100° C. selected from the group consisting of: aliphatic glycyl esters, fatty acids, organic waxes, silicone waxes and low melting organic salts.

2. The hot side material of claim 1 wherein said low melting borate glass is $Na_2B_4O_7$.

3. The hot side material of claim 1 wherein said alkali metal halide is selected from the group consisting of: NaBr and the NaCl-KCl eutectic.

4. The hot side material of claim 1 wherein said low melting phosphate glass is selected from the group consisting of: $KPO_3$ and $NaPO_3$.

5. The hot side material of claim 1 wherein said carbonate is $K_2CO_3$.

6. The cold side material of claim 1 wherein said aliphatic glycyl ester is tristearin.

7. The cold side material of claim 1 wherein said fatty acid is stearic acid.

8. The cold side material of claim 1 wherein said organic wax is paraffin.

9. The cold side material of claim 1 wherein said silicone wax is silicone grease.

10. The cold side material of claim 1 wherein said low melting inorganic salt is $Ca(NO_3)_2.4H_2O$.

* * * * *